United States Patent
Hsiao et al.

(10) Patent No.: US 8,778,717 B2
(45) Date of Patent: Jul. 15, 2014

(54) LOCAL OXIDATION OF SILICON PROCESSES WITH REDUCED LATERAL OXIDATION

(75) Inventors: Ru-Shang Hsiao, Jhubei (TW); Chung-Te Lin, Tainan (TW); Nai-Wen Cheng, Tainan (TW); Yin-Kai Liao, Taipei (TW); Wei Chuang Wu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 65 days.

(21) Appl. No.: 12/726,215

(22) Filed: Mar. 17, 2010

(65) Prior Publication Data
US 2011/0230002 A1    Sep. 22, 2011

(51) Int. Cl.
*H01L 21/00*    (2006.01)

(52) U.S. Cl.
USPC .. 438/60; 438/221; 257/E21.18; 257/E21.343

(58) Field of Classification Search
CPC ............... H01L 21/823418; H01L 21/823412; H01L 21/823814; H01L 21/823885; H01L 27/0921
USPC .............. 438/60, 221, 369, 407; 257/E21.18, 257/E21.343
See application file for complete search history.

(56) References Cited

U.S. PATENT DOCUMENTS

| | | | |
|---|---|---|---|
| 5,049,966 A * | 9/1991 | Wald | 257/612 |
| 6,245,638 B1 * | 6/2001 | Gardner et al. | 438/424 |
| 6,300,218 B1 * | 10/2001 | Cohen et al. | 438/423 |
| 6,335,562 B1 * | 1/2002 | Dietrich et al. | 257/631 |
| 6,341,093 B1 * | 1/2002 | Eckert et al. | 365/201 |
| 6,440,805 B1 * | 8/2002 | Wang et al. | 438/282 |
| 6,465,846 B1 * | 10/2002 | Osanai | 257/347 |
| 6,660,613 B2 | 12/2003 | Kim et al. | |
| 7,385,232 B2 * | 6/2008 | Patrick | 257/187 |
| 7,645,676 B2 * | 1/2010 | Furukawa et al. | 438/407 |
| 7,705,381 B2 * | 4/2010 | Shinohara et al. | 257/292 |
| 2003/0013260 A1 * | 1/2003 | Gossmann et al. | 438/301 |
| 2004/0235280 A1 * | 11/2004 | Keys et al. | 438/528 |
| 2006/0008938 A1 * | 1/2006 | Mouli et al. | 438/60 |
| 2006/0208333 A1 * | 9/2006 | Goto | 257/487 |
| 2007/0096179 A1 * | 5/2007 | Kwak | 257/292 |
| 2008/0176372 A1 * | 7/2008 | Beasom | 438/286 |
| 2008/0213935 A1 * | 9/2008 | Tsukamoto | 438/60 |
| 2009/0039428 A1 | 2/2009 | Wu et al. | |
| 2009/0042357 A1 * | 2/2009 | O'Connell et al. | 438/407 |

FOREIGN PATENT DOCUMENTS

| | | |
|---|---|---|
| EP | 1 840 957 A1 | 10/2007 |
| TW | 518710 | 1/2003 |
| TW | 200905792 | 2/2009 |
| TW | 200908208 | 2/2009 |

* cited by examiner

*Primary Examiner* — Caridad Everhart
(74) *Attorney, Agent, or Firm* — Slater and Matsil, L.L.P.

(57) ABSTRACT

A method of forming an integrated circuit structure includes providing a silicon substrate, and implanting a p-type impurity into the silicon substrate to form a p-type region. After the step of implanting, performing an anneal to form a silicon oxide region, with a portion of the p-type region converted to the silicon oxide region.

17 Claims, 6 Drawing Sheets

US 8,778,717 B2

LOCAL OXIDATION OF SILICON PROCESSES WITH REDUCED LATERAL OXIDATION

TECHNICAL FIELD

This disclosure relates generally to integrated circuits, and more particularly to the local oxidation of silicon (LOCOS) processes with reduced lateral oxidation.

BACKGROUND

Modern integrated circuits are formed on the surfaces of semiconductor substrates, which are mostly silicon substrates. Semiconductor devices are isolated from each other by isolation structures formed close to the surface of the respective semiconductor substrates. The isolation structures include field oxides and shallow trench isolation (STI) regions.

Field oxides are often formed using local oxidation of silicon (LOCOS) processes. A typical formation process is shown in FIGS. 1 and 2, which are cross-sectional views. Referring to FIG. 1, mask layer 4 is formed on silicon substrate 2. Mask layer 4 is then patterned and a portion of silicon substrate 2 is exposed through mask layer 4. A thermal oxidation is then performed in an oxygen-containing environment so that the exposed portion of silicon substrate 2 is oxidized. As a result, as shown in FIG. 2, LOCOS region 6 is formed. Mask layer 4 is then removed.

In other examples, buried oxides (BOXs) are formed in bulk silicon substrates to form insulation regions. Referring to FIG. 3, silicon substrate 2 is provided, and an oxygen implantation is performed to implant oxygen ions to inner region 8 that is buried under surface region 10 of silicon substrate 2. A high-temperature anneal is then performed (in an oxygen-free environment) to turn the oxygen-embedded inner region 8 into a buried silicon oxide layer. The anneal temperature is about 1350° C. Surface region 10, on the other hand, remains substantially un-oxidized. The resulting structure is a silicon-on-insulator structure, as shown in FIG. 4, which includes silicon substrate 2, BOX 12 on silicon substrate 2, and surface region 10 on BOX 12.

SUMMARY

In accordance with one aspect, a method of forming an integrated circuit structure includes providing a silicon substrate, and implanting a p-type impurity into the silicon substrate to form a p-type region. After the step of implanting, performing an anneal to form a silicon oxide region with a portion of the p-type region converted to the silicon oxide region.

In accordance with an alternative aspect, a method of forming an integrated circuit structure includes forming a mask over a silicon substrate, and patterning the mask to form an opening. A co-implantation is then performed. The co-implantation includes implanting a p-type impurity through the opening and into the silicon substrate to form a p-type region; and implanting an oxygen-containing material through the opening and into the silicon substrate to form an oxygen-implanted region. After the step of performing the co-implanting, an anneal is performed to convert the oxygen-implanted region to a silicon oxide region. After the anneal, the mask is removed.

Shallow trench isolation (STI) regions are formed in the silicon substrate. The STI regions may be formed before or after the formation of the silicon oxide region.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative, and do not limit the scope of the present disclosure.

A novel local oxidation of silicon (LOCOS) process for forming isolation regions is provided. The intermediate stages in the manufacturing of an embodiment are illustrated. The variations of the embodiment are discussed. Throughout the various views and illustrative embodiments, like reference numbers are used to designate like elements.

Figure 1:
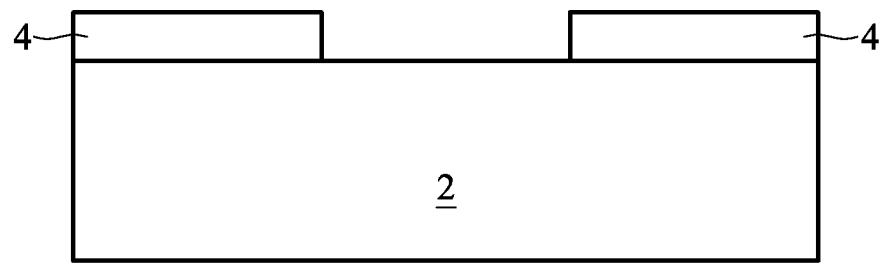
FIGS. 1 and 2 illustrate cross-sectional views of intermediate stages in the manufacturing of a silicon oxide region using a local oxidation of silicon (LOCOS) process.
Figure 2:
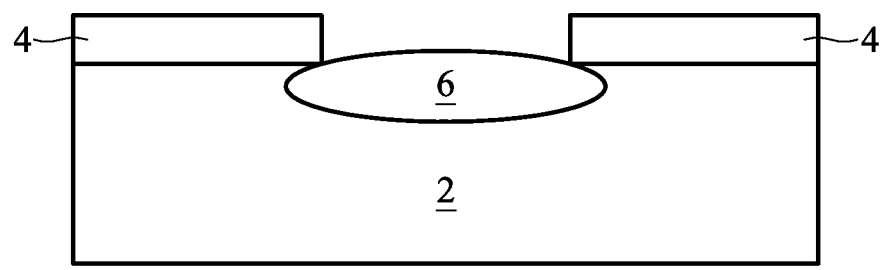
Figure 3:
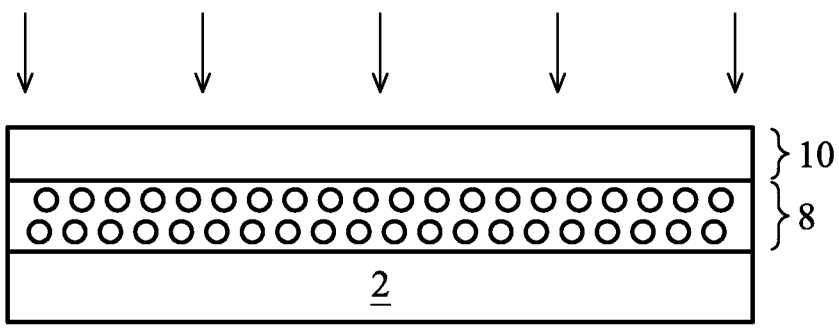
FIGS. 3 and 4 illustrate cross-sectional views of intermediate stages in the manufacturing of a silicon-on-insulator substrate.
Figure 4:
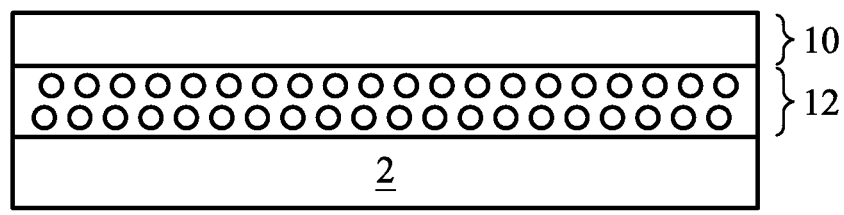
Figure 5:
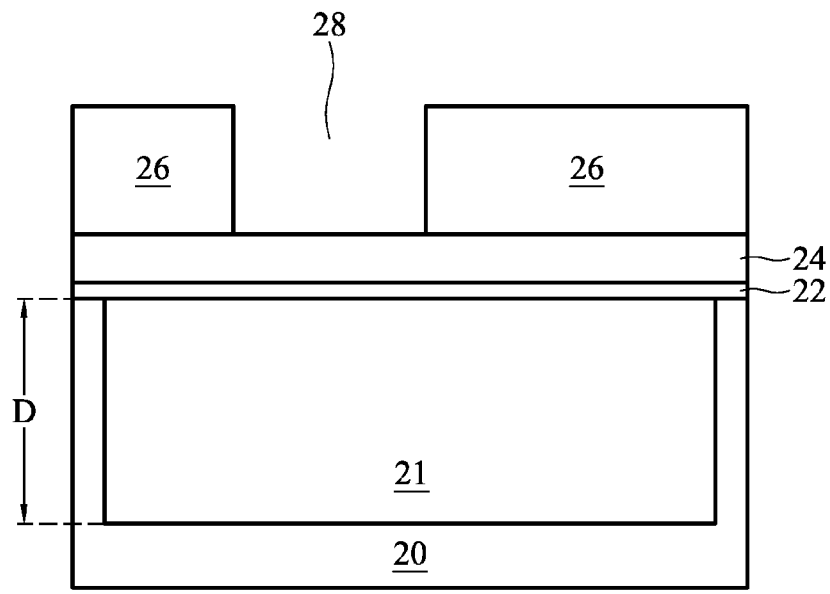
FIGS. 5 through 10 are cross-sectional views of intermediate stages in the manufacturing of an integrated circuit structure in accordance with an embodiment.

Referring to FIG. 5, semiconductor substrate 20 is provided. In an embodiment, semiconductor substrate 20 includes silicon. Other commonly used materials, such as carbon, germanium, gallium, arsenic, nitrogen, indium, and/or phosphorus, and the like, may also be added into semiconductor substrate 20. Semiconductor substrate 20 may be a bulk (silicon) substrate or a silicon-on-insulator (SOI) substrate. Well region 21 may be formed in semiconductor substrate 20. In an embodiment, well region 21 is a p-well region. Depth D of well region 21 may be between about 10 μm and about 20 μm, for example. It is realized, however, that the values recited in the present disclosure are merely examples.

Pad layer 22 and mask layer 24 may be formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In an embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography processes. Photo resist 26 is formed on mask layer 24 and is then patterned, forming openings 28 in photo resist 26.

Figure 6:
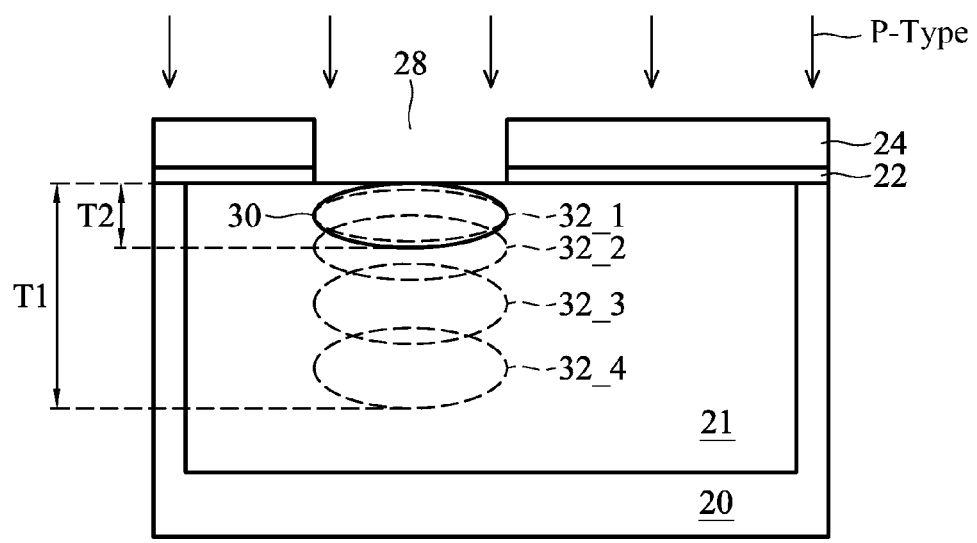

Referring to FIG. 6, mask layer 24 and pad layer 22 are etched through openings 28, exposing the underlying semiconductor substrate 20. Photo resist 26 is then removed. In an embodiment, a co-implantation is performed to implant oxygen and boron into semiconductor substrate 20, wherein mask layer 24 is used as the mask for the implantation. The implantation is symbolized by arrows. In alternative embodiments, oxygen is co-implanted with a p-type impurity selected from boron, aluminum, gallium, indium, and combinations thereof. A resulting structure is shown in FIG. 6, wherein the oxygen implanted region is illustrated as region 30, while the p-type implanted region 32 is illustrated as including regions 32_1, 32_2, 32_3, and 32_4.

In an exemplary embodiment, oxygen is implanted using an energy between about 5 keV and about 100 keV. Additional implantations using different energies may also be used to extend the thickness of the oxygen-implanted region 30. The implantation of the p-type impurity may include a plurality of implantations in order to achieve a more uniform distribution in a great depth. In an exemplary embodiment, the p-type impurity implantation is performed using an energy between about 10 keV and about 30 keV, an energy between about 40 keV and about 60 keV, an energy between about 160 keV and about 200 keV, and an energy between about 280 keV and about 320 keV, and the resulting p-type regions are illustrated as regions 32_1, 32_2, 32_3, and 32_4. The resulting depth T1 of the p-type regions 32 may be greater than depth T2 of oxygen-implanted region 30, with the ratio T1/T2 being greater than about 1/20, or even greater than about 1/15, for example.

Furthermore, the implantation dosage for oxygen may be between about $1E15/cm^2$ and about $1E17/cm^2$, while the implantation dosages for forming each of p-type regions 32_1, 32_2, 32_3, and 32_4 may be between about $1E12/cm^2$ and about $1E13/cm^2$. It is appreciated that the implantation energies and dosages are merely examples, and different values may be used. In an exemplary embodiment, the p-type impurity is doped before the implantation of oxygen, although a reversed order may be used. It is noted that p-well region 21 is also doped with p-type impurity(ies), and the p-type impurity concentration in p-type region 32 may be higher than, substantially equal to, or lower than that in p-well region 21.

In other embodiments, the implantation (through opening 28) only includes the implantation of the p-type impurity, while no oxygen is implanted. In yet other embodiments, the implantation only includes the implantation of oxygen, while no p-type impurity is implanted. The dosages and the energies of the p-type impurity and oxygen may be essentially the same as that used in the co-implantation.

Figure 7:
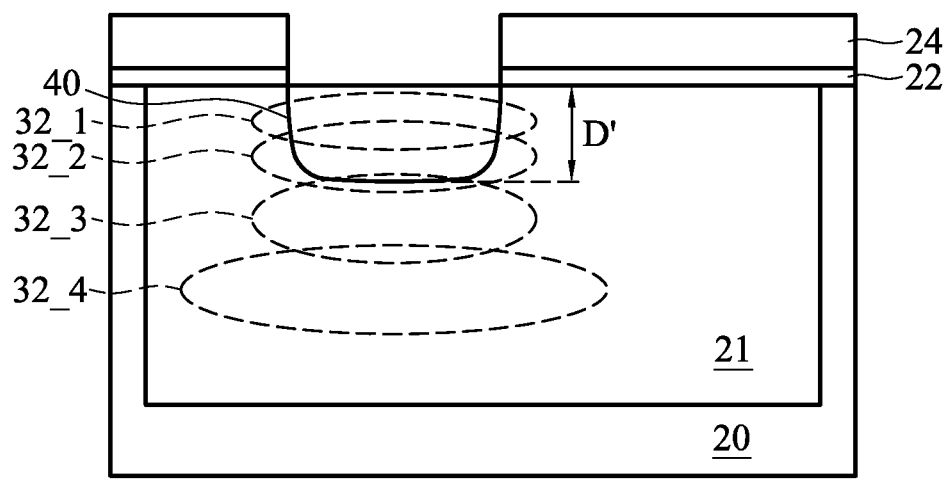

After the co-implantation (or the implantation of the p-type impurity or oxygen), an anneal is performed to convert at least a portion, for example, an upper portion, of the co-implanted regions into LOCOS region 40, as is illustrated in FIG. 7. The anneal may be performed in an oxygen-containing environment. In an embodiment, the anneal is performed in a chamber filled with oxygen ($O_2$), wherein the partial pressure of oxygen may be between about $1E(-2)$ torrs and about $5E2$ torrs, although higher partial pressure may be used. Carrier gases, such as inert gases, may also be introduced into the chamber. The anneal may be performed at a temperature between about 800° C. and about 1100° C., although different temperatures may be used. The anneal may be performed for a duration between about 1 minute and about 100 minutes, although different periods of time may be used, depending on the desirable depth of LOCOS region 40. The resulting depth D' of LOCOS region 40 may be between about 100 Å and about 4000 Å, depending on various factors, such as the anneal duration, the temperature, the partial oxygen pressure, the depth of the oxygen-implanted region 30, and the like. After the anneal, hard mask 24 and pad layer 22 may be removed.

It is appreciated that LOCOS region 40 comprises the implanted p-type impurity with a relatively high impurity concentration. In an exemplary embodiment, the p-type impurity concentration in LOCOS region 40 is greater than about $1E14/cm^3$, or even greater than about $1E17/cm^3$. On the other hand, a bottom portion of silicon substrate 20 that is free from any implantation may only have a p-type impurity concentration lower than about $1E15/cm^3$.

Figure 8:
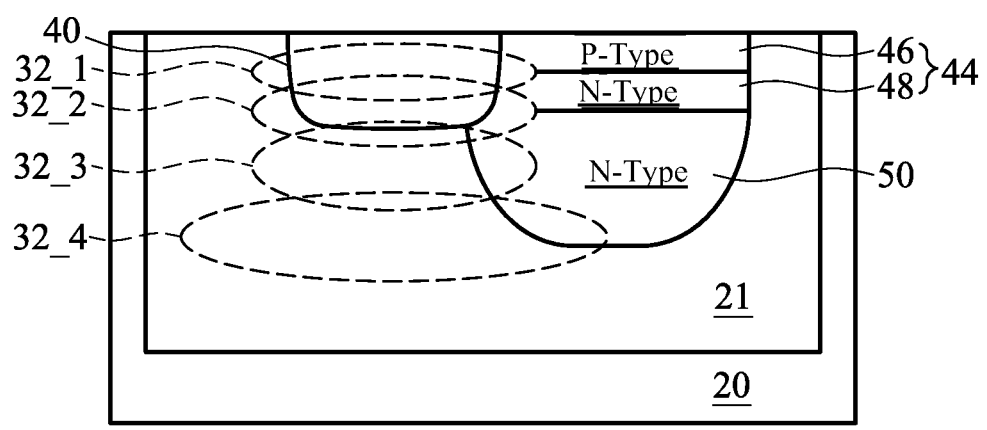

Referring to FIG. 8, photo diode 44 is formed by implanting p-type impurities to form p-type region 46 and n-type impurities to form n-type regions 48 and 50. For example, the p-type implantation for forming p-type region 46 may include the implantation of BF2, although other n-type impurities may be used. The n-type implantations for forming n-type regions 48 and 50 may include the implantation of arsenic, although other n-type impurities may be used. N-type region 48 is a shallow n-type region, and n-type region 50 is a deep n-type region. The p-n junction of photo diode 44 is formed between p-type region 46 and n-type region 48. P-well region 21 is used for isolating photo diode 44 from substrate 20, and for reducing the leakage from photo diode 44 to substrate 20. In an embodiment, after the anneal (or even before the anneal), a bottom of p-type isolation regions, such as region 32_4, is lower than a bottom of depletion region. N-type regions 48 and 50 may laterally contact n-type regions 32_1, 32_2, 32_3, and/or 32_4.

Figure 9:
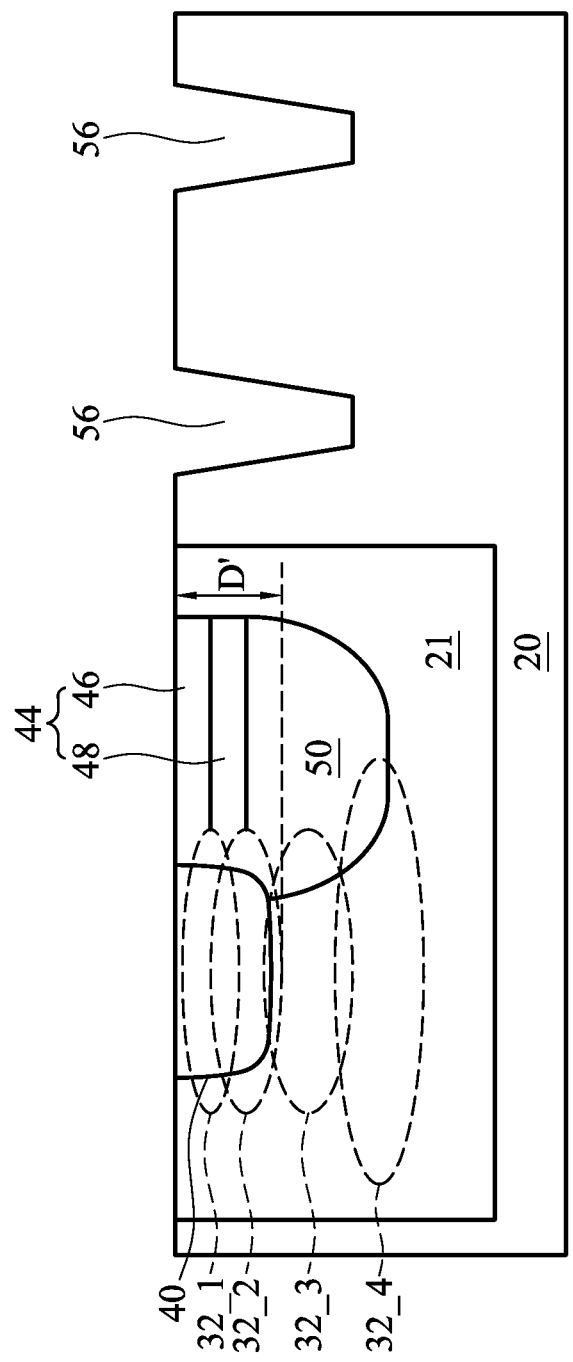
Figure 10:
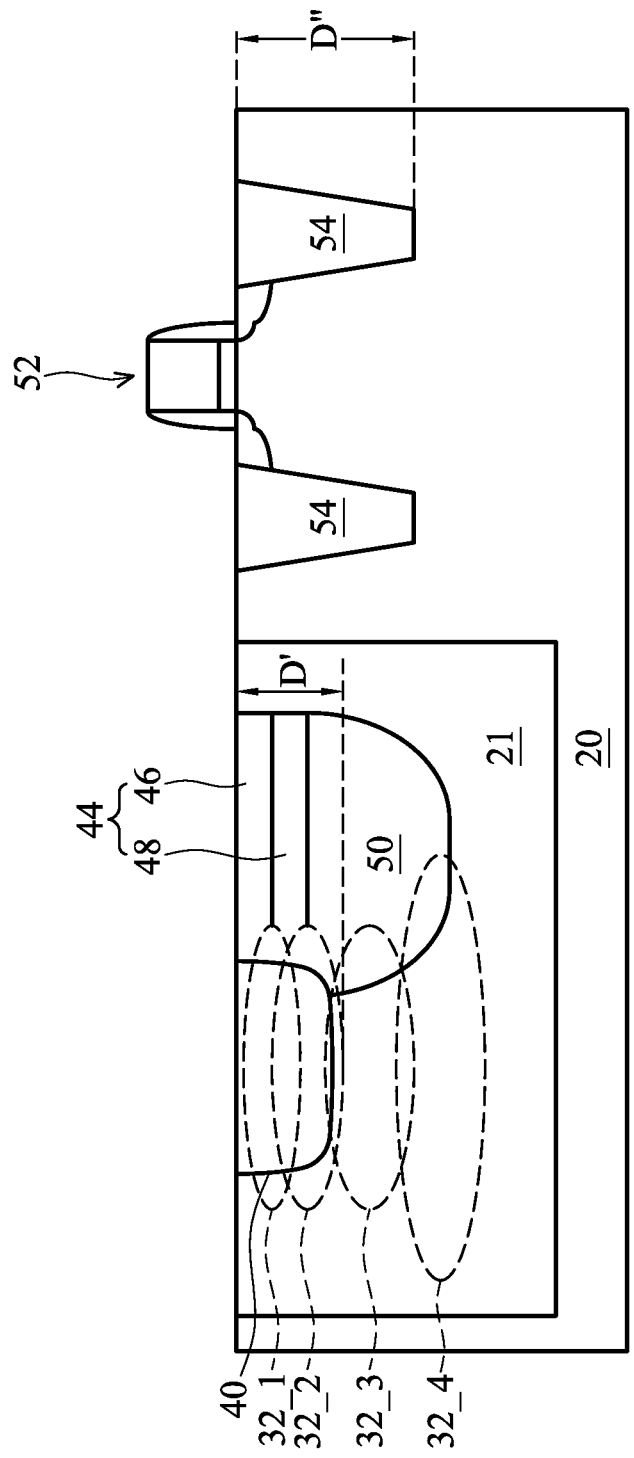

FIGS. 9 and 10 illustrate the formation of STI regions 54, which are formed in semiconductor substrate 20. The formation of STI regions 54 may be performed before or after the formation of LOCOS regions 40. Depth D" of STI regions 54 may be greater than, equal to, or less than, depth D' of LOCOS regions 40. In an exemplary embodiment, STI regions 54 may isolate MOS device 52 from other circuit regions. To form STI regions 54, referring to FIG. 9, trenches 56 are formed in substrate 20, for example, by etching into semiconductor substrate 20. A dielectric material is then filled into trenches 56, followed by a chemical mechanical polish to remove excess dielectric materials. The remaining portions of the dielectric materials in trenches 56 form STI regions 54, as shown in FIG. 10.

It is observed that the embodiments may be used for small-scale integrated circuits, such as 45 nm technology and below. This is partially because that with the additional p-type implantation (for example, a boron implant) in p-type regions 32_1, 32_2, the oxidation rate is enhanced, and hence the lateral growth of LOCOS region 40 is suppressed, and the sizes of the active regions defined by the LOCOS regions may be controlled more precisely. Furthermore, with the oxygen co-implantation, the required partial oxygen pressure and duration for the anneal may be reduced, which results in the further reduction in the lateral growth of LOCOS region 40. Experiment results have revealed that when boron is implanted (with no oxygen co-implanted), a ratio of the lateral width to the depth of the resulting LOCOS region 40 may be as low as about 1.39. As a comparison, if no p-type impurity is implanted before the anneal, the ratio of the lateral width to the depth of the resulting LOCOS region may be as high as about 1.98, which means a significantly small lateral growth result from the boron implantation.

On the other hand, with a same target depth (for example, 900 Å) and same anneal temperature for the LOCOS processes, the required anneal time for the boron-implanted LOCOS process is only about 20 percent of the required anneal time for the LOCOS process if no p-type impurity is co-implanted. With a much shorter anneal time, the requested thermal budget is significantly reduced, and the dopant profile (such as the profile of well regions that are formed before the formation of LOCOS regions 40) may be controlled more precisely. If oxygen is co-implanted, even better results can be obtained.

Furthermore, the p-type regions 32_1, 32_2, 32_3, and 32_4 adjoining photo diode 44 may act to reduce the leakage current (white pixel current) for photo diode 44. Also, compared to shallow trench isolation (STI) regions, the detrimental stress caused by the LOCOS regions is smaller than that caused by STI regions, which further results in the reduction in the white pixel currents of the photo diodes.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit structure, the method comprising:
    implanting a p-type impurity into a p-well region of a silicon substrate to form a p-type region;
    co-implanting oxygen into the p-well region of the silicon substrate to form an oxygen-implanted region, wherein a portion of the p-type region overlaps the oxygen-implanted region;
    after the step of implanting and the step of co-implanting, performing an anneal to form a silicon oxide region, with a portion of the p-type region converted to the silicon oxide region; and
    forming a photo diode in the silicon substrate, with an n-type region of the photo diode laterally contacting the p-type region.

2. The method of claim 1, wherein the portion of the p-type region converted to the silicon oxide region is an upper portion of the p-type region, and a lower portion of the p-type region is not converted to the silicon oxide region.

3. The method of claim 1, wherein the p-type impurity is implanted into a p-well of the silicon substrate.

4. The method of claim 1, wherein the anneal is performed at a temperature between about 800° C. and about 1100° C.

5. The method of claim 1, wherein the anneal is performed for a duration between about 1 minute and about 100 minutes.

6. The method of claim 1, wherein the anneal is performed in a chamber with a partial pressure of oxygen between about 1E(−2) torrs and about 5E2 torrs.

7. The method of claim 1, wherein the p-type impurity is selected from the group consisting essentially of boron, aluminum, gallium, indium, and combinations thereof.

8. The method of claim 1 further comprising forming a shallow trench isolation (STI) region comprising:
    forming a trench in the silicon substrate; and
    filling the trench with a dielectric material to form the STI region.

9. The method of claim 1 further comprising:
    before the step of implanting the p-type impurity, forming a mask layer over the silicon substrate, with an opening formed in the mask layer, wherein the p-type region is formed by implanting through the opening; and
    after the step of performing the anneal, removing the mask layer.

10. The method of claim 9, wherein the step of co-implanting oxygen is performed through the opening in the mask layer.

11. A method of forming an integrated circuit structure, the method comprising:
    forming a mask over a p-well region of a silicon substrate;
    patterning the mask to form an opening;
    performing a co-implantation comprising:
        implanting a p-type impurity through the opening and into the p-well region of the silicon substrate to form a p-type region; and
        implanting an oxygen-containing material through the opening and into the p-well region of the silicon substrate to form an oxygen-implanted region, wherein the p-type region has a bottom lower than a bottom of the oxygen-implanted region;
    after the step of performing the co-implantation, performing an anneal to convert the oxygen-implanted region to a silicon oxide region; and
    after the anneal, removing the mask.

12. The method of claim 11 further comprising forming a photo diode in the silicon substrate, with an n-type region of the photo diode laterally contacting the p-type region.

13. A method of forming an integrated circuit structure, the method comprising:
    implanting a p-type impurity into a p-well region of a silicon substrate to form a p-type region;
    implanting oxygen into a portion of the silicon substrate directly over the p-type region, wherein a same mask is used in the steps of implanting oxygen and the p-type impurity;
    performing an oxidation process to a surface the portion of the silicon substrate comprising implanted oxygen to form a silicon oxide region; and
    forming a photo diode in the silicon substrate, with an n-type region of the photo diode laterally contacting the p-type region.

14. The method of claim 13, wherein substantially an entirety of the silicon oxide region comprises the p-type impurity.

15. The method of claim 13, wherein the p-type impurity comprises boron.

16. The method of claim 13, wherein the p-type impurity is implanted before the step of performing the oxidation process.

17. The method of claim 13 further comprising forming a shallow trench isolation (STI) region in the silicon substrate.

* * * * *